(12) United States Patent  
Miller (10) Patent No.: US 7,009,542 B2
(45) Date of Patent: Mar. 7, 2006

(54) SYSTEM AND METHOD FOR SPECTRAL SHAPING OF DITHER SIGNALS

(75) Inventor: Kevin Lee Miller, Lawrenceville, GA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/978,366

(22) Filed: Nov. 2, 2004

(65) Prior Publication Data

US 2005/0062626 A1  Mar. 24, 2005

Related U.S. Application Data

(63) Continuation of application No. 10/642,736, filed on Aug. 19, 2003, now Pat. No. 6,812,876.

(51) Int. Cl.
*H03M 3/00*  (2006.01)

(52) U.S. Cl. ..................................... 341/143
(58) Field of Classification Search ............... 341/131, 341/143; 375/244, 265; 331/18; 358/3.13
See application file for complete search history.

(56) References Cited

U.S. PATENT DOCUMENTS

| | | | | |
|---|---|---|---|---|
| 4,914,439 A | * | 4/1990 | Nakahashi et al. | 341/131 |
| 5,144,308 A | * | 9/1992 | Norsworthy | 341/131 |
| 5,311,180 A | * | 5/1994 | Borgen | 341/131 |
| 5,455,839 A | * | 10/1995 | Eyuboglu | 375/265 |
| 5,825,253 A | * | 10/1998 | Mathe et al. | 331/18 |
| 5,912,745 A | * | 6/1999 | Ulichney | 358/3.13 |
| 5,999,114 A | * | 12/1999 | Hendricks | 341/131 |
| 6,707,855 B1 | * | 3/2004 | Patana | 375/244 |

* cited by examiner

*Primary Examiner*—Jean Bruner Jeanglaude
(74) *Attorney, Agent, or Firm*—Sterne, Kessler, Goldstein & Fox PLLC (57) ABSTRACT

An improved dither generation circuit and method for digital audio circuits uses a high-pass filter to reduce the energy contained in the audio band of the dither signal. The resulting dither signal is applied to the circuit in its main feedback loop and is effective to prevent idle tones. Because of its spectrally shaped characteristic this dither signal introduces less noise into the audio band of interest and thereby improves the overall signal-to-noise ratio of the audio circuit. In an embodiment, the dither signal is generated using pseudo-random numbers that are then interpreted as 2's complement numbers.

20 Claims, 8 Drawing Sheets

SYSTEM AND METHOD FOR SPECTRAL SHAPING OF DITHER SIGNALS

This application is a continuation of U.S. patent application Ser. No. 10/642,736 filed Aug. 19, 2003, now U.S. Pat. No. 6,812,876, the entire disclosure of which is incorporated by reference.

BACKGROUND OF THE INVENTION

1. Field of the Invention

The present invention relates generally to improved apparatus and methods for dither signal generation in audio circuits to prevent idle tones, and includes particular applications of these circuits in digital modulators of a type useful in high fidelity audio processing.

2. Background Art

Dither signals are commonly generated in audio circuits to overcome the tendency of high-gain feedback amplification circuits to generate audible output tones (referred to as idle tones) during periods of low or zero input amplitude when the output should be low or zero. Dither signals in the form of white noise are typically introduced into the feedback circuit during periods of low input amplitude. However, this dithering function introduces a small but measurable amount of noise into the circuit and therefore reduces signal-to-noise ratios.

Digital-to-analog converters (DACs) are used to process digital audio signals. Typically digital data signals are received from a digital replay device or over a network, such as a cable television network. The signals are then processed by a DAC in an audio amplifier, cable receiver, or other audio device to produce an analog output within a frequency range that, when connected to a transducer such as a speaker, generates human audible sounds.

DACs used in high-fidelity audio processing typical include digital modulators that convert highly over-sampled digital values from high precision (16–20 bits) to low precision (1–3 bits), with the objective of substantially eliminating noise from the human audible band.

To prepare these low precision signals for conversion to analog form, they are mapped into digital sequences to prevent parasitic elements from degrading the signal. An analog signal is then generated from the mapped digital signal and transmitted to audio reproduction equipment.

Known DACs are susceptible to various types of signal distortion, harmonics, dependency on past output, and generation of unwanted output at low signal input levels. These circuits achieve high fidelity output through high-precision digital signal processing, and in this context degradation due to the introduction of dithering signals is a component of overall signal distortion. Therefore, improvement in dither signal generation to effect reductions of in-band noise component is desirable.

BRIEF SUMMARY OF THE INVENTION

An improved dither generation circuit and method for digital audio circuits generates pseudo-random numbers that are then interpreted as 2's complement numbers representing data points of a bipolar signal. The random number signal is high-pass filtered to reduce the energy contained in the audio band. The resulting dither signal is applied to the circuit in its main feedback loop and is effective to reduce or eliminate idle tones. Because of its spectrally shaped characteristic this dither signal introduces less noise into the audio band of interest and thereby improves the overall signal-to-noise ratio of the audio circuit.

These improved dithering methods and circuits are particularly useful in the context of high-fidelity digital modulator circuits, and in combination with other novel features developed by the same inventor for such circuits. As disclosed herein, the improved dithering methods are optionally and advantageously combined with particular improvements in mapping the output of a quantizer receiving the dither signals, and by including the mapping function in the circuit's main feedback loop.

DETAILED DESCRIPTION OF THE PREFERRED EMBODIMENT

Figure 1:
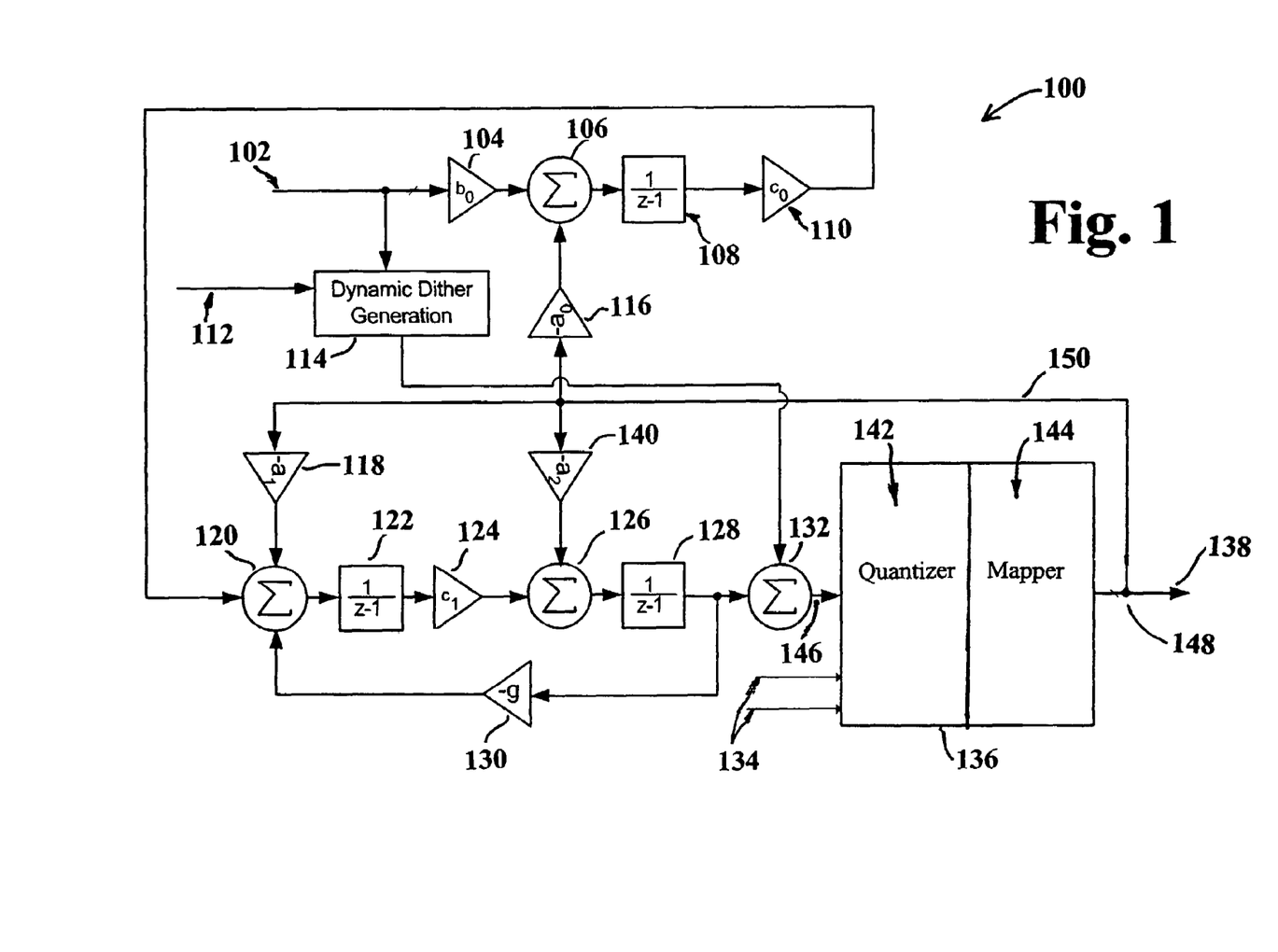
FIG. 1 is a block schematic diagram of a digital modulator circuit according to one embodiment of the invention.

The invention will be described with reference to several exemplary embodiments. FIG. 1 shows a first embodiment of the invention in the form of a digital modulator. In this embodiment, a pulse width modulation mapping function is performed within a high-gain digital modulator feedback loop, rather than subsequent to the feedback loop. In FIG. 1, the digital modulator is shown generally at 100. Digital modulator 100 has an input 102 and an output 138. The circuit of digital modulator 100 comprises a gain stage 104, a summing point 106, an integrator 108, a gain stage 110, a dither control input 112, a dither generation circuit 114, a gain stage 116, a gain stage 118, a summing point 120, an integrator 122, a gain stage 124, a summing point 126, an integrator 128, a gain stage 130, a summing point 132, one or more clock inputs 134, a gain stage 140, and a mapping circuit 136 incorporating a quantizer 142 and a mapper 144. Mapping circuit 136 has an input 146 and a feedback point 148 at its output 138 from which a feedback loop 150 extends to an input of each of gain stages 116, 118 and 140 respectively.

Digital modulator 100 is shown in block schematic form. The circuit represented by this diagram may be implemented in software operating on a general purpose processor, in hardware such as a custom integrated circuit, or in combinations thereof. Both hardware and software implementations are workable; hardware implementations currently have a lower cost and may be faster, and are generally preferred for these reasons.

The design of digital modulator 100 is particularly useful in high-fidelity audio applications such as cable television receivers (sometimes referred to as "set top boxes"). In the cable receiver application, digital modulator 100 converts highly over-sampled digital values from high precision (typically 16–20 bits) to low precision (1–3 bits). Quantization noise inherently increases with the reduction in precision. The digital modulation process is designed to push quantization noise out of the frequency band of interest, which in the case of a high-fidelity audio circuit is the human-audible band (typically between zero and no more than 40,000 Hz). The low-precision digital values are then quantized and mapped to digital sequences, for example by a pulse-width modulation process. The output of the circuit at output 138 is a digital bipolar pulse-width-modulated signal. In the exemplary cable receiver audio application, output 138 is connected through a low pass filter to an audio output jack (not shown).

Input 102 is connected to receive a high-precision digital signal (typically 18–20 bits) such as, for example, a digital cable TV audio signal or other high-precision information signal. Input 102 is connected to the input of gain stage 104 and is also connected as a control input to dither generation circuit 114. When the received input signal at input 102 has a low amplitude (below a predetermined threshold), dither generation circuit 114 is activated to introduce a dither signal to prevent the circuit from generating audible idle tones at its output. The dither signal output of dither generation circuit 114 is connected to summing point 132 and may be generated conventionally, such as by operating a linear feedback shift register to generate a pseudo-random noise sequence. Or, in another embodiment of the invention, dither generation may be accomplished using the novel dithering circuits and methods described below with reference to FIGS. 5 and 6.

Each of gain stages 104 and 116 has an output connected to summing point 106, the output of which is connected to an input of integrator 108. Integrator 108 has an output connected to an input of gain stage 110. Gain stage 110 has an output connected to a first of three inputs of summing point 120.

As noted above, feedback loop 150 extends from feedback point 148 at output 138 of mapping circuit 136, and is connected back to three points, the inputs of gain stages 116, 118 and 140 respectively. Gain stage 118 has an output connected to a second of three inputs of summing point 120. The signals received at summing point 120 are transmitted to an input of integrator 122. An output of integrator 122 is connected to an input of gain stage 124. An output of gain stage 124 is connected to an input of summing point 126. An output of gain stage 140 is similarly connected to provide the output signal of gain stage 140 to summing point 126. The sum of the signals received at summing point 126 is provided as an input to integrator 128 and integrated. An output of integrator 128 is connected to an input of summing point 132. The sum of the signals transmitted to summing point 132 by integrator 128 and the output of dither generation circuit 114 is provided at an output 146 of summing point 132. Output 146 of summing point 132 is connected to an input of quantizer 142. Another feedback loop is connected from the output of integrator 128 (at its input to summing point 132) to the input of gain stage 130, with the output of gain stage 130 connected to the third input of summing point 120.

Table A shows exemplary gain values for the gain stages used in the circuit:

TABLE A

| GAIN STAGE | INDICIA | GAIN VALUE |
|---|---|---|
| 116 | $a_0$ | $1/8 + 1/32$ |
| 118 | $a_1$ | $1/2 + 1/4$ |
| 140 | $a_2$ | $1 + 1/4$ |
| 104 | $b_0$ | $1/64 + 1/256$ |
| 110 | $c_0$ | $1/8$ |
| 124 | $c_1$ | $1/8$ |
| 130 | $g$ | $1/4096$ |

The gain values may be adjusted depending on the application and the bandwidth of both the input and the desired output. The example given has conjugate zeros of the filter established at about 23 kHz, providing a compromise between optimizing 20 kHz and 40 kHz output bandwidths.

Quantizer 142 converts data received from the modulator at output 146 to one of a plurality of voltage levels at one or more defined sampling rates. Quantizer specifications may be determined according to the requirements of the individual application. As an example, a seven-level quantizer that approximates the received data with an output belonging to the set consisting of: $\{-6, -4, -2, 0, 2, 4, 6\}$ works well in the application example described herein. Quantizer 142 has one or more clock inputs 134, such that quantizer 142 is provided with or can derive a clock signal for each sampling rate desired during operation. For example, in the cable receiver example described herein, a sample rate of 27 Mhz may be established, with a 3.375 Mhz clock also available at one-eighth of the overall sample rate. A seven-level sample is generated at the 27 Mhz rate with a new level evaluated and output every eight clocks at the 3.375 Mhz rate. In this example, mapper 144 puts out an 8-bit sequence corresponding to the evaluated level for eight clock cycles. Then the level is re-evaluated and a new output level is initiated based on the new level determination.

Mapper 144 may be a conventional mapper, such as a static type mapper, or may be capable of a novel "shuffle mapping" approach as described below with reference to FIG. 2 and FIGS. 3 and/or 4.

Feedback loop 150 differs from conventional feedback arrangements in that the modulator feedback loop typically includes the quantizer function only, and not the mapping function. That is, the feedback point is typically between quantizer 142 and mapper 144 in conventional systems of this type, and mapping functions are thus performed after the feedback loop. The inventor has discovered that the pulse width modulation mapping function of mapper 144 generates a fairly large harmonic content when cascaded with the digital modulator circuit and tends to dramatically change the shape of the noise floor in the desired band, e.g. 0–40,000 Hz. In contrast, placing the mapping function within high-gain digital modulator feedback loop 150, as shown in FIG. 1, tends to compensate for the non-linear features of the mapping function, thus reducing harmonic generation and simplifying the task of suppressing harmonic generation to an acceptable level. In addition to reducing harmonic generation, this arrangement simplifies feedback processing and the accumulation of feedback information within the various integrators in the modulator circuit. The arrangement of the feedback loop and the generation of the same output signal for successive clock cycles suppresses harmonic content and pushes the noise floor back to its original shape. In exemplary implementations the signal-to-noise ratio (SNR) is 109 dB for 0–20,000 Hz and 96 dB for 0–40,000 Hz signal ranges, respectively.

Figure 2:
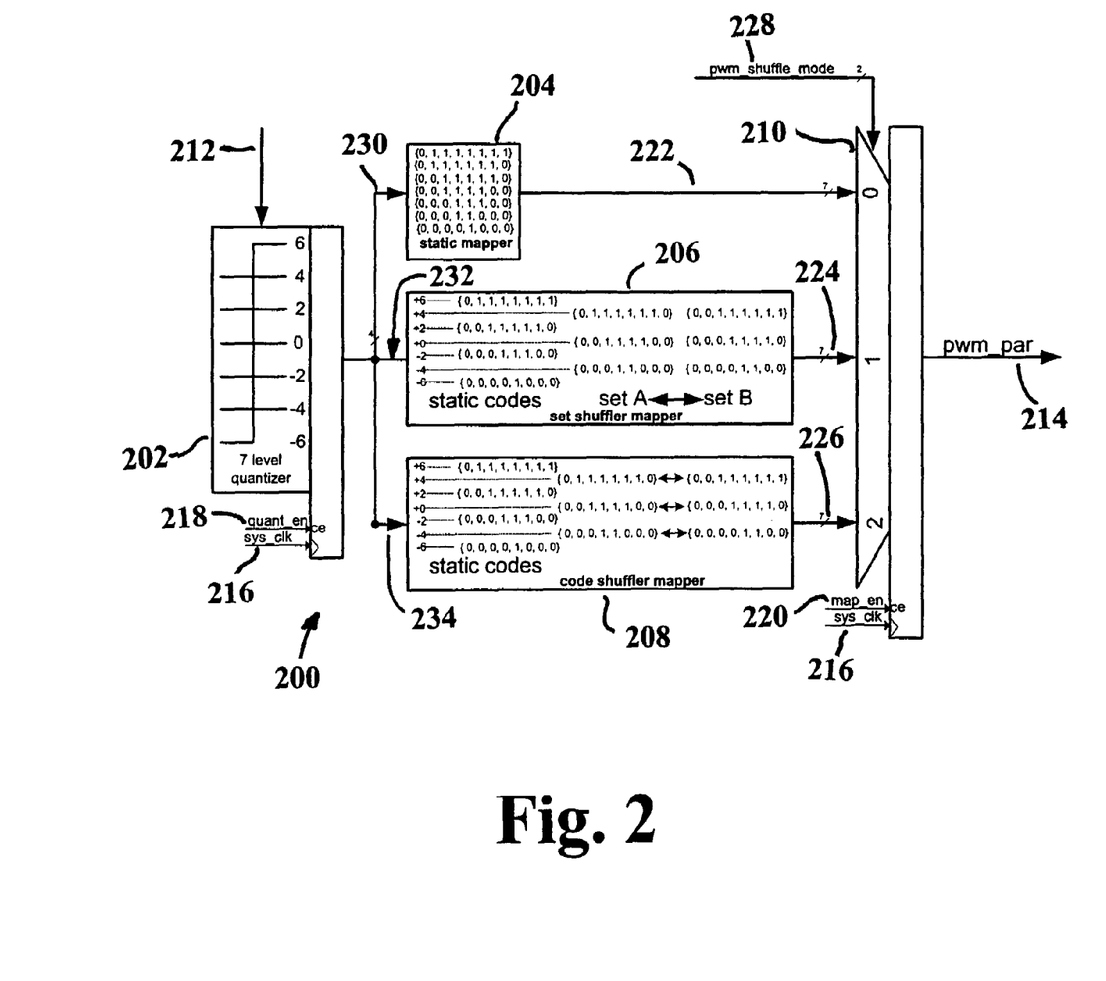
FIG. 2 is a block schematic diagram of an enhanced mapper according to an embodiment of the invention.

FIG. 2 is a block schematic diagram showing various embodiments and design options for an improved mapper 200. The features disclosed herein with reference to mapper 200 may be implemented in combination with any or all of the other circuit features disclosed in this specification. Some or all of the features of mapper 200 may also implemented separately for use with any other type of circuit and/or application where a mapping is desired. As an example, mapper 200 may be used in generalized pulse width modulation applications or in other appropriate mapping processes where the features of mapper 200 provide useful advantages.

Mapper 200, in the embodiment shown, comprises quantizer 202, static mapper 204, set shuffler mapper 206, code shuffler mapper 208, and mode selection switch 210. Static mapper 204 has an input 230, set shuffler mapper 206 has an input 232, and code shuffler mapper 208 has an input 234 respectively. Quantizer 202 has an input 212 to which an input signal is connected and has an output connected to three points: input 230 of static mapper 204, input 232 of set shuffler mapper 206, and input 234 of code shuffler mapper 208. Mapper 200 has an output 214 at mode selection switch 210. Output 214 provides a pulse width modulated signal based on the level of the input signal at input 212. A system clock 216 is connected to both quantizer 202 and mode selection switch 210. Quantizer enable signal 218 is connected to quantizer 202, and mapper enable signal 220 is connected to mode selection switch 210. Quantizer enable signal 218 and mapper enable signal 220 are actuated by a control circuit (not shown) to enable the operation of quantizer 202 and the output of mapper 200 respectively.

Mode selection switch 210 has three signal inputs (0,1,2) and a mode control input 228. Static mapper 204 has an output 222, set shuffler mapper 206 has an output 224, and code shuffler mapper 208 has an output 226. Outputs 222, 224 and 226 are connected to the three inputs of mode selection switch 210 respectively. Mode selection switch 210 provides one of the signals received at its three inputs to its output 214 depending on the mode selected by a signal provided at mode control input 228. In this way, mode selection switch 210 can be used to selectively transmit to mapper output 214 the output of static mapper 204, set shuffler mapper 206, or code shuffler mapper 208 depending on the desired mapping operation. The type of mapping to be used can be selected.

In cases where multi-mode operation is not required, it is not necessary to provide three different parallel mapping circuits selected through mode selection switch 210 as shown in FIG. 2. Any single mapping circuit or any two of the mapping circuits can be selected if the other types of mapping operations are not required for the application. In the case of a single mapping circuit, either set shuffler mapper 206 or code shuffler mapper 208 is provided alone, without the other mapping circuits. In this case, if desired, mode selection switch 210 may be omitted so that the respective output of set shuffler mapper 206 or code shuffler mapper 208 is provided directly to output 214.

In the embodiment shown, quantizer 202 is a seven-level quantizer that receives a digital representation of an analog signal level and generates an output that is one of seven levels from the set consisting of {6, 4, 2, 0, −2, −4, −6}. The selected output varies with the value of the input signal as follows: The expected range of input levels is divided into, in this case, seven sub-ranges. The value of the input signal is determined in response to a level change in system clock 216. Then, the sub-range to which the input signal value belongs is determined, and the voltage level output corresponding to that sub-range is generated. In a preferred embodiment, the same voltage level output is maintained for eight clock cycles, and thereafter the level may change to a new value for the next eight clock cycles, as the process repeats beginning with the determination of the value of the input signal.

In operation, static mapper 204 receives one of the seven voltage levels and generates a serial digital output corresponding to that level. One appropriate serial digital bit sequence for this static mapping is illustrated in Table B.

TABLE B

| LEVEL NUMBER | VOLTAGE | BIT SEQUENCE |
|---|---|---|
| | −6 | 0, 0, 0, 0, 1, 0, 0, 0 |
| | −4 | 0, 0, 0, 0, 1, 1, 0, 0 |
| | −2 | 0, 0, 0, 1, 1, 1, 0, 0 |
| | 0 | 0, 0, 0, 1, 1, 1, 1, 0 |
| | 2 | 0, 0, 1, 1, 1, 1, 1, 0 |
| | 4 | 0, 0, 1, 1, 1, 1, 1, 1 |
| | 6 | 0, 1, 1, 1, 1, 1, 1, 1 |

FIG. 7 is a waveform diagram corresponding to the bit sequences of Table B. FIGS. 7a through 7g show waveforms 702, 706, 710, 714, 718, 722 and 726 produced at the output of static mapper 204, corresponding to level numbers 1 through 7 in Table B respectively. Waveforms 702, 706, 710, 714, 718, 722 and 726 have time-based centroids 704, 708, 712, 716, 720, 724 and 728 respectively. As can be seen in FIGS. 7a through 7g, the centroid position varies; centroids 704, 712, 720 and 728 are located at t=4.5 clock cycles from the beginning of the pulse output, while centroids 708, 716 and 724 are located at t=5 clock cycles after the beginning of the pulse output.

Based on experimental analysis, the inventor has identified this shifting of centroids as a source of non-linearity in the mapper output, and has determined that centroid shifting is a significant source of harmonic generation in the circuit. The inventor has further determined that if the centroids of the output waveforms can be kept at the same time point measured from the start of each waveform, non-linearities and thus harmonic levels are substantially reduced.

Figure 7A:
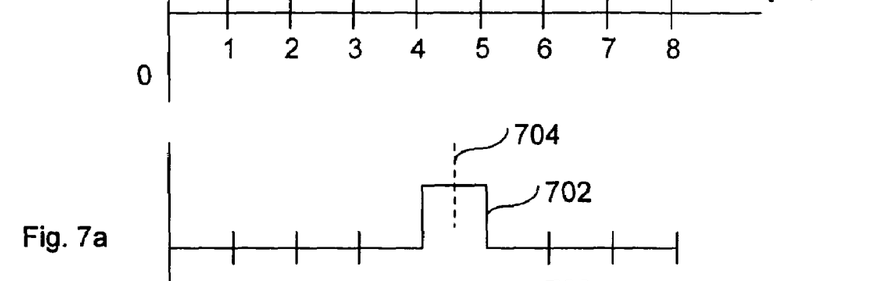
FIGS. 7a through 7j are waveform diagrams showing features of a pulse width modulated mapper output in an embodiment of the invention.
Figure 7B:
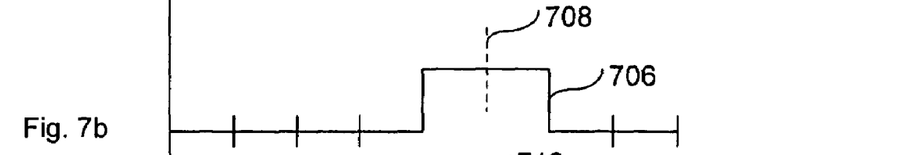
Figure 7C:
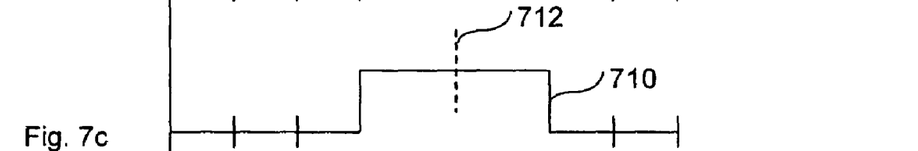
Figure 7D:
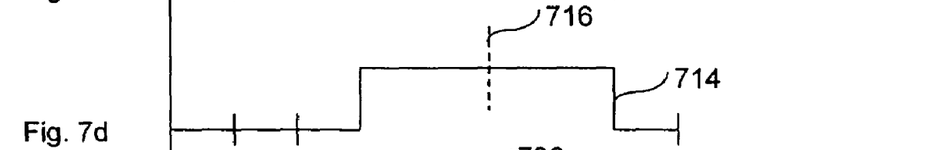
Figure 7E:
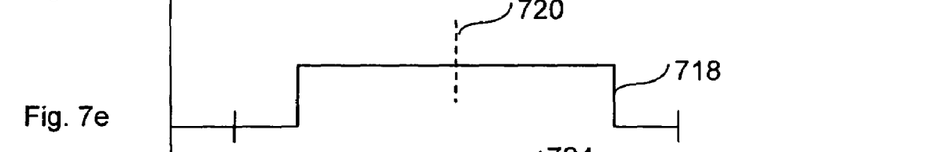
Figure 7F:
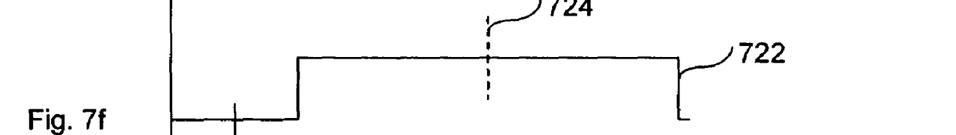
Figure 7G:
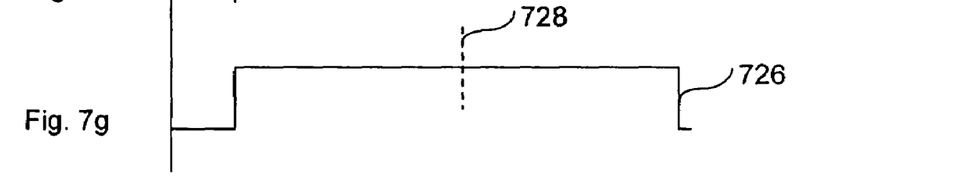
Figure 7H:
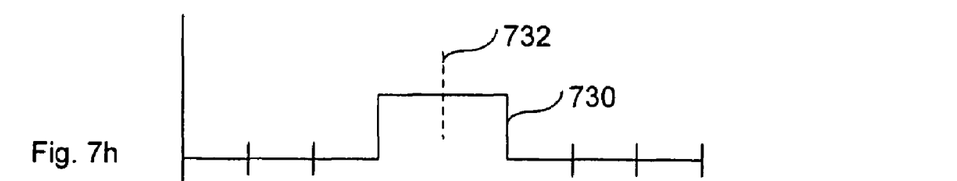
Figure 7I:
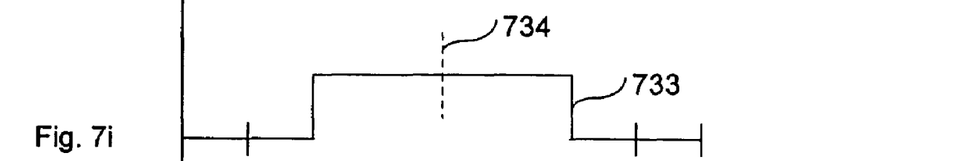
Figure 7J:
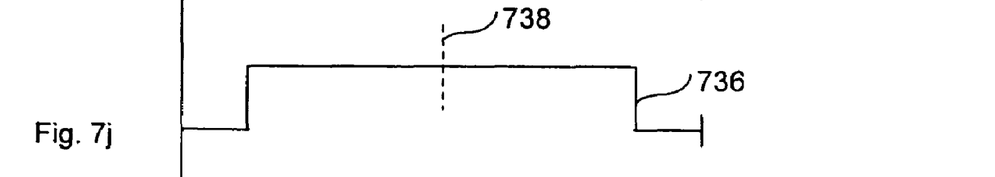

FIGS. 7h, 7i and 7j show waveforms that are identical to the waveforms shown in FIGS. 7b, 7d and 7f respectively, but are time-shifted by one clock cycle. Pulse 730 in FIG. 7h has a duration of two clock cycles, corresponding to pulse 706 in FIG. 7b. Pulse 733 in FIG. 7i has a duration of four clock cycles, corresponding to pulse 714 in FIG. 7d. Pulse 736 in FIG. 7j has a duration of six clock cycles corresponding to pulse 722 in FIG. 7f. Pulses 730, 733 and 736 have centroids 732, 734, and 738 respectively. Centroids 732, 734 and 738 are located at t=4 clock cycles, rather than at t=5 clock cycles as in the case of pulses 706, 714, and 722. The pulses shown in FIGS. 7h, 7i and 7j constitute a set of pulses (referred to as Set A) with centroids at t=4, and the pulses shown in FIGS. 7b, 7d and 7f constitute a set of pulses (referred to as Set B) having centroids at t=5. The inventor has discovered that if an equal number of otherwise identical pulses from Set A and Set B are transmitted, over time the average centroid of the resulting transmission will be at t=4.5. Exemplary serial bit transmission sequences for Set A and Set B outputs are shown in Table C.

TABLE C

| LEVEL NUMBER | VOLTAGE | SET A | SET B |
| --- | --- | --- | --- |
| 1 | −6 | 0, 0, 0, 0, 1, 0, 0, 0 | 0, 0, 0, 0, 1, 0, 0, 0 |
| 2 | −4 | 0, 0, 0, 1, 1, 0, 0, 0 | 0, 0, 0, 0, 1, 1, 0, 0 |
| 3 | −2 | 0, 0, 0, 1, 1, 1, 0, 0 | 0, 0, 0, 1, 1, 1, 0, 0 |
| 4 | 0 | 0, 0, 1, 1, 1, 1, 0, 0 | 0, 0, 0, 1, 1, 1, 1, 0 |
| 5 | 2 | 0, 0, 1, 1, 1, 1, 1, 0 | 0, 0, 1, 1, 1, 1, 1, 0 |
| 6 | 4 | 0, 1, 1, 1, 1, 1, 1, 0 | 0, 0, 1, 1, 1, 1, 1, 1 |
| 7 | 6 | 0, 1, 1, 1, 1, 1, 1, 1 | 0, 1, 1, 1, 1, 1, 1, 1 |

Referring again to FIG. 2, the operation of set shuffler mapper 206 and code shuffler mapper 208 will now be described in further detail. These shuffler mappers reduce output harmonics compared to static mapper 204 by maintaining a substantially identical average centroid for each of the seven possible output waveforms. In general, this objective is accomplished by generating waveforms using the bit sequences shown in Table C, alternating between Set A and Set B. More than two sets could be used if desired as long as the sets provide the desired centroid output when used in combination.

Figure 3:
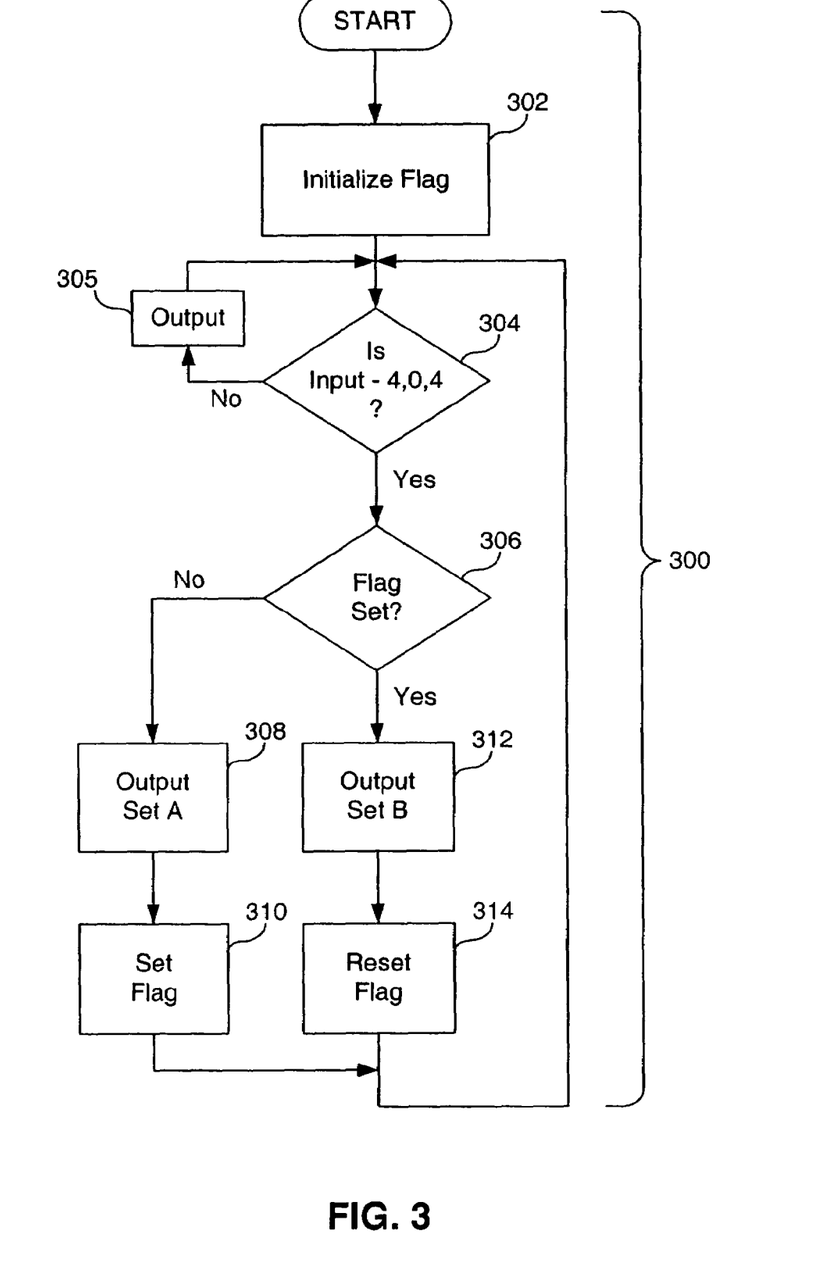
FIG. 3 is a flow chart illustrating a set shuffler mapping operation according to an embodiment of the invention.
Figure 4:
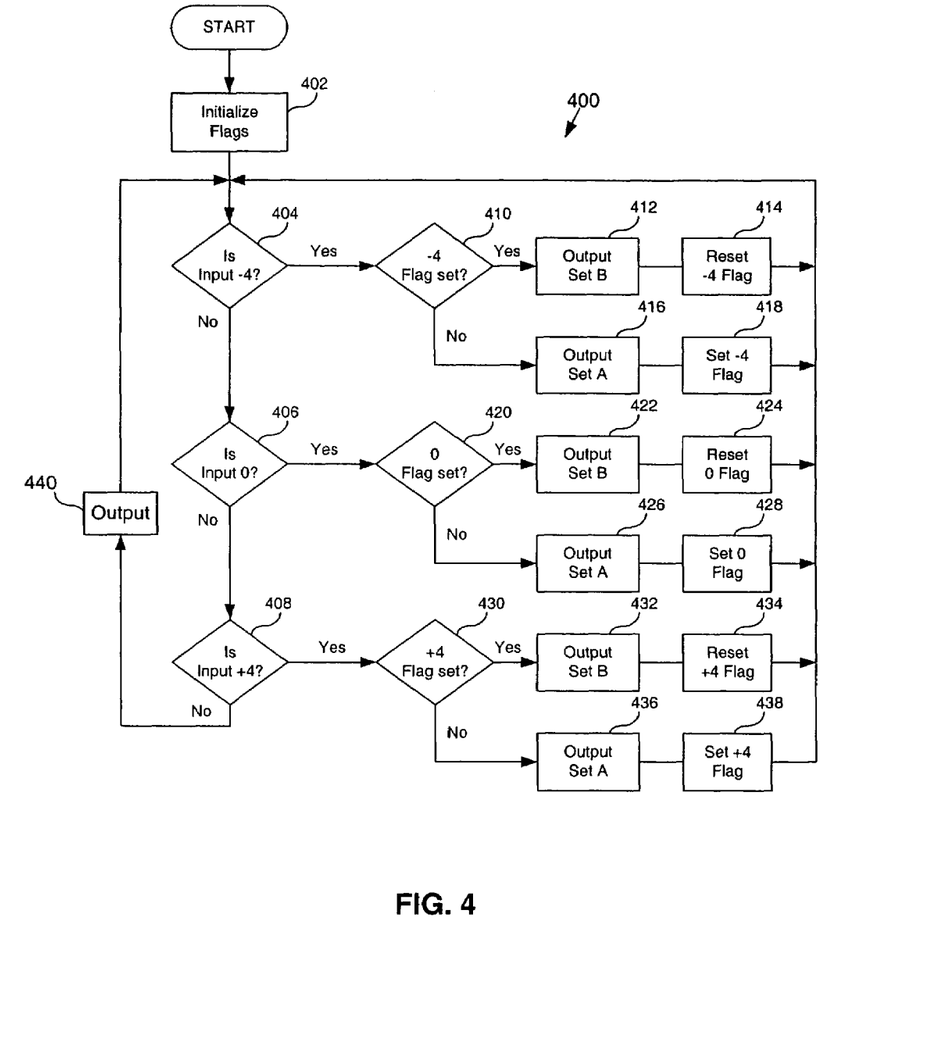
FIG. 4 is a flow chart illustrating a code shuffler mapping operation according to an embodiment of the invention.

An embodiment of set shuffler mapper 206 operates according to the flow chart of FIG. 3. FIG. 3 shows a process 300 for shuffling between the Set A and Set B outputs shown in Table C. The process begins at block 302 where a tracking flag is initialized. The initialization is optional and the initial setting of the flag may be selected arbitrarily, since the output will merely be shuffled over time between settings corresponding to the two possible tracking flag values.

Next, in block 304, the process determines whether output shuffling is required, based on the input value. In this example, output shuffling is required when the input value is −4, 0, or 4. In the embodiment shown, for input values −6, −2, 2, and 6, the Set A and Set B outputs are identical so no output shuffling is required. Thus, if the input value is not −4, 0, or 4, control passes to block 305 and the output sequence is transmitted as shown in Table C with no differences between Set A and Set B operation. If output shuffling is required, control passes to block 306. If the tracking flag was set, Set B output is indicated; if the tracking flag was not set, Set A output is indicated. Thus, in Block 306, if the tracking flag is set control passes to block 312 and the Set B serial bit sequence corresponding to the input value is generated; the tracking flag is then reset in block 314. If the tracking flag is not set, control passes to block 308 and the Set A serial bit sequence corresponding to the input value is generated, after which the tracking flag is set in block 310. After these output operations and flag setting operations, control returns to block 304 where the next input is processed.

Thus, the process of FIG. 3 generates outputs that alternate between Set A and Set B for those serial bit sequences with a waveform centroid differing from an overall average centroid location. In the embodiment shown, inputs −6, −2, 2, and 6 generate output sequences with a waveform centroid centered at t=4.5 clock cycles. For the other three input values, −4, 0 and 4, the process of FIG. 3 alternates between generating waveforms from a set with centroids at t=4 clock cycles (Set A) and waveforms from a set with centroids at t=5 clock cycles. This operation produces seven different output waveforms, each with a time-averaged centroid at t=4.5 clock cycles. Maintaining the same average centroid for each output waveform produces increased linearity of operation and reduces output harmonics.

FIG. 4 shows a process flow chart for an embodiment of code shuffler mapper 208 (shown in FIG. 2). This process will describe code shuffling for a mapper with a seven-level quantizer input as shown in FIG. 2, and can also be easily adapted by those skilled in the art to operate with a different input structure. Code shuffling process 400 begins at block 402 where three flags are initialized—one each for the −4, 0, and 4 voltage input levels. In general, in code shuffling process 400, a flag is provided for each input level that will generate shuffled pulse outputs. The determination of whether to initialize the flags to one or zero is arbitrary, and in fact initialization can be omitted if desired. The flag will be inverted each time the input corresponds to the voltage level corresponding to that flag, and the output will shuffle alternately between the settings corresponding to flag=0 and flag=1; over time it will not matter which of the shuffled outputs was generated first.

Next, the value of the input is determined and a branching operation is performed based on the input level starting at block 404. If the input level is −4, control passes to block 410. If the input level is zero, control passes from block 404 to block 406 and then to block 420. If the input level is +4, control passes through block 406 to block 408 and then to block 420. If the input level is another value, i.e. a value that will not involve shuffling in this embodiment, control passes to block 440 where the non-shuffled pulse corresponding to the input level is generated as an output. The process then begins again at block 404.

If the input level is −4, the value of the −4 flag is evaluated at block 410. If this flag is set, the Set B pulse for level −4 is generated as an output at block 412, the −4 flag is reset at block 414 to complete the operation, and control passes back to block 404. If the −4 flag is not set, the Set A pulse for level −4 is generated as an output at block 416, the −4 flag is set at block 418 to complete the operation, and control passes to block 404.

If the input level is zero, the value of the zero flag is evaluated at block 420. If this flag is set, the Set B pulse for level zero is generated as an output at block 422, the zero flag is reset at block 424 to complete the operation, and control passes back to block 404. If the zero flag is not set, the Set A pulse for level zero is generated as an output at block 426, the zero flag is set at block 428 to complete the operation, and control passes to block 404.

If the input level is +4, the value of the +4 flag is evaluated at block 430. If this flag is set, the Set B pulse for level +4 is generated as an output at block 432, the +4 flag is reset at block 434 to complete the operation, and control passes back to block 404. If the +4 flag is not set, the Set A pulse for level +4 is generated as an output at block 436, the +4 flag is set at block 438 to complete the operation, and control passes to block 404.

As can be seen, code shuffler mapping process 400 differs from set shuffler mapping process 300 (shown in FIG. 3) in that code shuffler mapping process 400 tracks output corresponding to each of the input levels with individual flags, and shuffles the output codes individually for each such input level. That is, in the set shuffler mapping process, each time an even-width pulse is to be generated, it is generated with a shifted centroid relative to the last even-width pulse generated. In the code shuffler mapping process, each time a pulse is generated with width=2 (or width=4 or 6) is generated, it is generated with a centroid shifted relative to the last pulse generated with width=2 (or 4 or 6), regardless of the centroid status of other recent even-width pulses. The code shuffler mapping process requires additional data storage in the form of flag bits and a marginal increase in program code to implement the branching operations, but these additional storage requirements can be met without significant difficulty if the code shuffler mapping process is considered desirable for a particular application.

As can be seen, embodiments of the shuffler mappers take two sequences defined for each level, with different pulse centroids, and chooses each of the two sequences 50% of the time. The result of this operation is that the average output centroid corresponding to the level is midway between the pulse centroids of two sequences that are alternately generated. Some code levels have an output with a single pulse that has the desired centroid location; the output correponding to these code levels is not shuffled.

In the embodiments described herein for both set shuffler mapper 206 and code shuffler mapper 208 the shuffled pulse outputs are those outputs having a pulse width of an even number of bits or clock cycles. In particular the pulses of width 2, 4, and 6 are shuffled while the pulses with width 1, 3, 5, and 7 are not shuffled. It should be noted that it is also possible to reverse this structure and shuffle the odd-width pulses while generating the even-width pulses with a constant centroid. For example, the even width pulses may be generated so their centroids are at t=4 and the odd width pulses may each be alternated (shuffled) between centroids of t=3.5 and t=4.5 to likewise generate an average centroid at t=4. In the seven-level embodiments shown, it is preferred to shuffle the even-width pulses because shuffling a pulse of width 7 (shown in FIG. 7g) would raise the first bit of each byte in half of those pulse generations. Having a "Ø" as the first bit ensures that all 8 bit sequences start from the same level, therefore eleminating sequence-to-sequence interaction.

Figure 5:
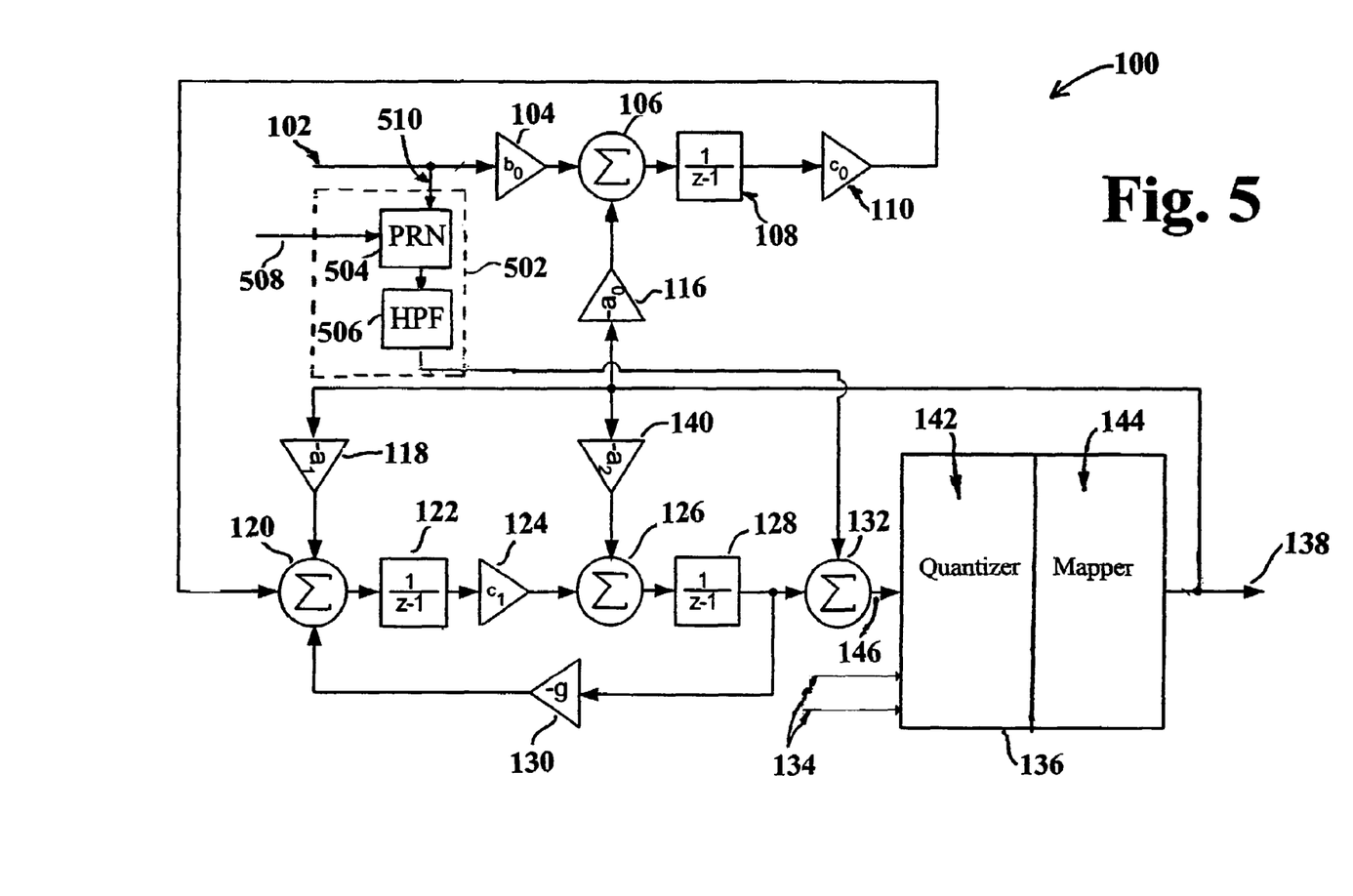
FIG. 5 is a block schematic diagram of a modulator performing spectral shaping of a dither signal as provided in some embodiments of the invention.

FIG. 5 is a block schematic diagram showing a modification of the circuit of FIG. 1 to provide spectral shaping of a dither signal. In general, a dither signal is a random word sequence added to the quantizer input of the modulator to break up idle tones which would otherwise be generated due to inherent circuit characteristics when the input data stream is "idle," e.g. has a low input amplitude.

FIG. 5 shows the modulator circuit 100 modified to incorporate an improved dither generation circuit 502. Dither generation circuit 502 includes pseudo-random number (PRN) generator circuit 504 and filter circuit 506. Input 102, the high speed data input of the modulator circuit, is connected to input 510 of PRN generator circuit 504. A control input 508 is also connected to PRN generator circuit 504. PRN generator circuit 504 monitors input 510 to determine when the input signal level has amplitude below a predetermined threshold, such that a dither signal should be generated to prevent idle tone outputs from the modulator circuit. PRN generator circuit 504 provides circuitry for generating a pseudo-random number sequence. For example, PRN generator circuit 504 may incorporate a linear feedback shift register. Control input 508 provides further activating control signals to the PRN generator circuit to control the generation of dither signals. For example, dither signals may be enabled or disabled by an external control circuit depending on operational requirements.

The output of PRN generator circuit 504 is connected to filter circuit 506. Filter circuit 506 is a high-pass filter (HPF) circuit. The output of HPF filter circuit 506 is connected to summer 132; thus the dither signal output generated by dither generation circuit 502 is added to the signal at output 146 provided to quantizer 142.

The inventor has found that pre-filtering the dither signal using HPF filter circuit 506 before the dither signal is added to the quantizer input reduces signal-to-noise ratio degradation. In particular, for the modulator application it is desirable to filter the dither signal so it has little or no energy in the audio band. In particular, the energy of the signal should be concentrated in the band above 20 kHz and even more preferably in the band above 40 kHz. Pre-filtering of the dither signal can be accomplished using several methods, either individually or in combination. The first method involves the generation and interpretation of the noise signal used to generate the dither. As noted previously, a linear feedback shift register can be used to produce a pseudo-random number sequence in the dither generator. The bits of the shift register in the linear feedback shift register are then used as digital words that can be used in a variety of formats. The inventor has discovered that the choice of format affects the quality of the output. If the shift register output words are interpreted as offset binary words, a constant can be subtracted from each value in the sequence to produce a DC mean of zero. This results in a white (flat) noise spectrum usable as a dither signal. The inventor has discovered that interpreting the shift register output as 2's complement binary words produces a signal that is immediately bipolar and has an inherent high-pass characteristic. In addition to interpreting the generated pseudo-random numbers as 2's complement words, the resulting words are preferably passed through a first order difference network with a zero at DC. Combining these two methods produces a dither signal with approximately a 40 dB per decade slope having a high-pass characteristic. This reduces noise resulting from the introduction of dither in the low pass band and reduces the overall signal-to-noise ratio of the modulator.

The inventor has found that pre-filtering the dither signal before adding it to the quantizer input as described above effectively minimizes dither energy in the audio band, thereby reducing degradation of the signal-to-noise ratio occurring in more conventional dither circuits.

The dithering methods disclosed herein are particularly useful in circuits of the type shown in FIG. 5; however, those skilled in the art will recognize that the improved dithering methods disclosed herein can be applied to other types of circuits including dithering functions.

Figure 6:
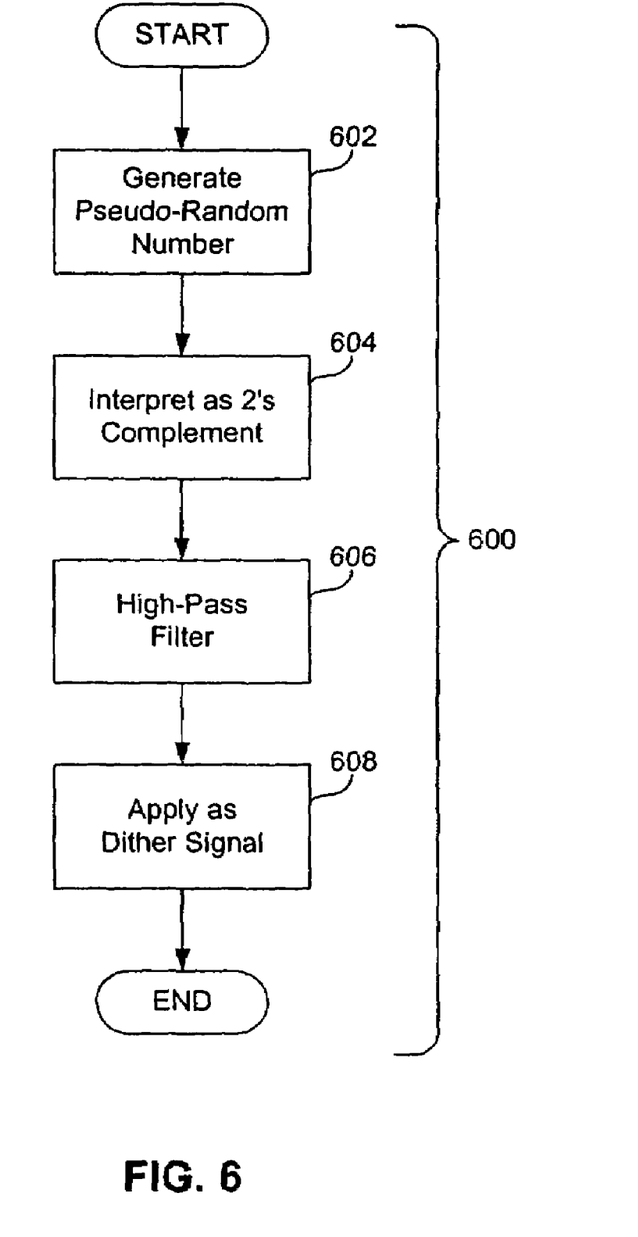
FIG. 6 is a flow chart showing a process for spectral shaping of the dither signal.

FIG. 6 is a flow chart showing the generation of a dither signal according to an embodiment of the improved method disclosed herein. Dither generation process 600 begins with generation of a pseudo-random number (PRN) in block 602. Then, in block 604, the PRN is interpreted as a 2's complement number representing a bipolar signal. In block 606, the resulting value is high-pass filtered, and in block 608 the filtered bipolar value is added to the signal input of the quantizer as a dither signal.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

I claim:

1. A method for dithering in a digital signal processing circuit, comprising the steps of:
   (1) generating a series of numbers to produce a digital data stream representing a dither signal;
   (2) dithering signal values processed by the digital signal processing circuit using said digital data stream to provide dithered signal values; and
   (3) selecting one of a plurality of mappers to map said dithered signal values to respective digital sequences.

2. The method of claim 1, wherein step (1) comprises using a pseudo-random number generator to generate said series of numbers.

3. The method of claim 2, wherein said pseudo-random number generator comprises a linear feedback shift register.

4. The method of claim 1, wherein said digital signal processing circuit is a digital modulator circuit.

5. The method of claim 4, wherein said digital modulator circuit is part of a cable television receiver.

6. A method for digital dithering in a digital signal processing circuit, comprising the steps of:
   (1) generating a series of numbers;
   (2) high-pass filtering said series of numbers to generate a digital data stream representing a dither signal;
   (3) dithering signal values processed by the digital signal processing circuit using said digital data stream to provide dithered signal values; and
   (4) mapping said dithered signal values in a feedback of the digital signal processing circuit.

7. The method of claim 6, wherein said dither signal represented by said data stream is attenuated at low frequencies with its energy concentrated in a band above 20 kHz.

8. The method of claim 7, wherein said dither signal represented by said data stream has its energy concentrated in a band above 40 kHz.

9. The method of claim 6, wherein step (1) comprises processing said series of numbers in two's complement format.

10. The method of claim 6, wherein step (1) comprises using a pseudo-random number generator to generate said series of numbers.

11. The method of claim 10, wherein said pseudo-random number generator comprises a linear feedback shift register.

12. The method of claim 6, wherein said digital signal processing circuit is a digital modulator circuit.

13. The method of claim 12, wherein said digital modulator circuit is part of a cable television receiver.

14. The method of claim 1, further comprising interpreting said digital data stream in two's complement format.

15. The method of claim 1, wherein mapping said dithered signal values is performed in response to quantizing said dithered signal values.

16. The method of claim 1, wherein mapping said dithered signal values is performed using a set shuffler mapper.

17. The method of claim 1, wherein mapping said dithered signal values is performed using a code shuffler mapper.

18. The method of claim 1, further comprising feeding back an output of said selected mapper.

19. The method of claim 1, wherein mapping said dithered signal values further includes maintaining a substantially identical average centroid for output waveforms of said digital signal processing unit.

20. The method of claim 6, further comprising maintaining a substantially identical average centroid for output waveforms corresponding to said signal values.

* * * * *